(12) United States Patent  
Bayan

(10) Patent No.: US 7,678,617 B1
(45) Date of Patent: Mar. 16, 2010

(54) UNIVERSAL LAMINATOR

(75) Inventor: Jaime Bayan, Palo Alto, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 515 days.

(21) Appl. No.: 11/614,282

(22) Filed: Dec. 21, 2006

(51) Int. Cl.
H01L 21/00 (2006.01)

(52) U.S. Cl. .................. 438/123; 438/122; 257/670; 257/672; 257/676; 257/690; 257/692

(58) Field of Classification Search ............ 438/122, 438/123; 257/670, 672, 676, 690, 692–696, 257/782–784
See application file for complete search history.

(56) References Cited

U.S. PATENT DOCUMENTS 4,653,993 A   3/1987   Boschman
6,041,840 A * 3/2000   Ogawa ................. 156/382
6,797,540 B1 * 9/2004   Li et al. ................ 438/111

* cited by examiner

Primary Examiner—Thao X Le
Assistant Examiner—Elias Ullah
(74) Attorney, Agent, or Firm—Beyer Law Group LLP

(57) ABSTRACT

An improved arrangement and process for packaging integrated circuits are described. More particularly, a universal lamination tool is described that functions to secure an adhesive film to a lead frame. The lamination tool of the present invention uses compressed gas to press the lead frame against the adhesive film. In this manner, the lamination tool itself does not physically press on the lead frame thereby substantially reducing the likelihood of damage to the bonding wires or other delicate components during this stage of the encapsulation process. Moreover, such a lamination tool is not package specific making it applicable for a wide variety of package configurations and lead frame sizes.

10 Claims, 3 Drawing Sheets

UNIVERSAL LAMINATOR

BRIEF DESCRIPTION OF THE INVENTION

The present invention generally relates to the packaging of integrated circuits (ICs). More particularly, methods of encapsulating dice in IC packages are described.

BACKGROUND OF THE INVENTION

There are a number of conventional processes for packaging integrated circuits. Many packaging techniques use a lead frame that has been stamped or etched from a metal sheet to provide electrical interconnects to external devices. A die is electrically connected to portions of the lead frame via bonding wires or other suitable electrically connections. Generally, the die, lead frame and bonding wires are then encapsulated in a mold while leaving selected portions of the lead frame exposed to facilitate electrical connection to external devices.

There are a number of processes for encapsulating such IC packages. One relatively recently developed encapsulation process is film-assisted molding. In film-assisted molding, the bottom surface of the lead frame is not pre-taped prior to encapsulation, rather, the lead frame is positioned on an adhesive film. A package specific lamination tool then presses on designated portions of the lead frame to ensure good adhesion between the adhesive film and the lead frame. The adhesive film then prevents molding compound from covering the portions of the lead frame that are in contact with the adhesive film during encapsulation. After the molding compound has cured, the encapsulated lead frame and film are removed from the mold and the film is peeled off of the lead frame.

Although existing film-assisted molding techniques, and others, work well, there are continuing efforts to develop even more efficient designs and methods for encapsulating integrated circuits.

SUMMARY OF THE INVENTION

An improved arrangement and process for packaging integrated circuits are described. More particularly, a universal lamination tool, and a method of using the same, is described that functions to secure an adhesive film to a lead frame.

The lamination tool of the present invention uses compressed air to press the lead frame against the adhesive film. In this manner, the lamination tool itself does not physically press on the lead frame thereby substantially reducing the likelihood of damage to the bonding wires or other delicate components during this stage of the encapsulation process. Moreover, such a lamination tool is not package specific making it applicable for a wide variety of package configurations and lead frame sizes.

In one embodiment, the lamination tool includes a housing containing a sealable chamber. The chamber is preferably arranged to accommodate at least portions of a lead frame panel. The lead frame panel is positioned such that the bottom surface of the lead frame panel is in contact with the upper surface of an adhesive film. The bottom surface of the adhesive film is in contact with the bottom surface of the chamber. The housing is configured to compress gas within the chamber when the chamber is sealed. In various embodiments, the housing is coupled to a compressor or compressed gas tank that introduces compressed air into the chamber. In other embodiments a gas, or gases, other than air are compressed in the chamber.

When the air in the chamber is compressed, a resultant net force is developed on the lead frame that presses the lead frame against the adhesive film. The air should be compressed to an ample pressure such that the resultant net force on the lead frame is sufficient to firmly secure the lead frame to the adhesive film without damaging the die, bonding wires, or other delicate electrical components. The firmly secured adhesive film prevents molding compound from covering the portions of the lead frame that are in contact with the adhesive film during encapsulation.

BRIEF DESCRIPTION OF THE DRAWINGS

For a better understanding of the invention, reference should be made to the following detailed description taken in conjunction with the accompanying drawings, in which.

Like reference numerals refer to corresponding parts throughout the drawings.

DETAILED DESCRIPTION OF THE DRAWINGS

The invention relates generally to the packaging of integrated circuits (ICs). More particularly, a method and system for use in encapsulating dice in IC packages are described.

In the following description, numerous specific details are set forth to provide a thorough understanding of the present invention. It will be apparent, however, to one skilled in the art that the present invention may be practiced without some or all of these specific details. In other instances, well known process steps have not been described in detail in order to avoid unnecessary obscuring of the present invention.

There are a number of processes for encapsulating IC packages, which vary according to the intended use of the package, the desired size of the package and the lead frame or other such substrate used, among other factors. An embodiment of the present invention will now be described with respect to an exemplary lead frame based package; however, it will become apparent to one of skill in the art that the present invention may be practiced in packaging dice employing a wide variety of lead frame and lead frame panel configurations, as well as to other package styles not employing lead frames.

Figure 1A:
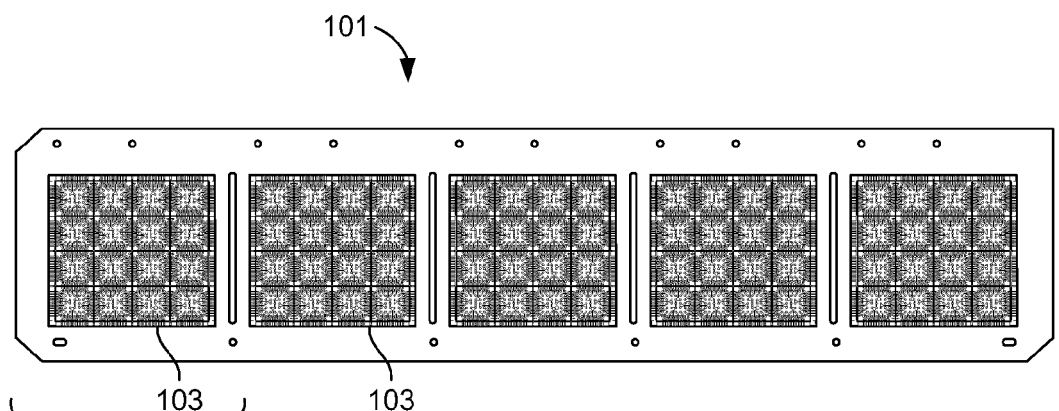
FIG. 1A-C illustrates diagrammatic top views of an exemplary lead frame panel suitable for use in packaging integrated circuits according to an embodiment of the present invention.
Figure 1B:
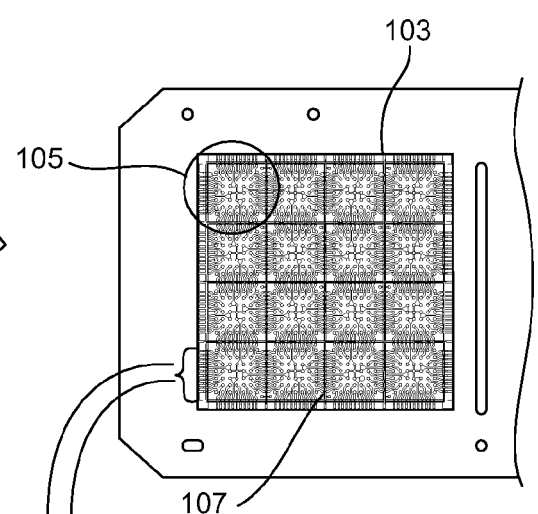
Figure 1C:
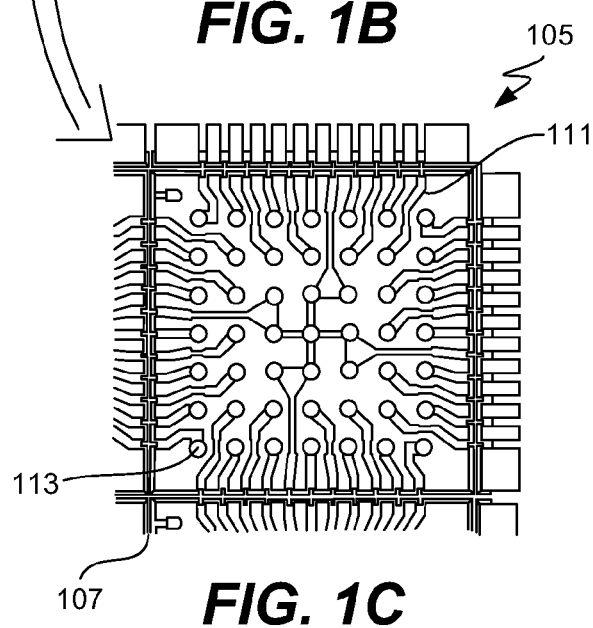

With respect to FIGS. 1A-C, an exemplary lead frame panel 101 suitable for use in packaging integrated circuits according to various embodiments of the present invention will be described. FIG. 1A illustrates a diagrammatic top view of a lead frame panel 101 arranged in the form of a strip. The lead frame panel 101 can be configured as a metallic structure with a number of two-dimensional arrays 103 of device areas. As illustrated in the successively more detailed FIGS. 1B-C, each two-dimensional array 103 includes a plurality of device areas 105, each configured for use in a single IC package, and each connected by fine tie bars 107. During packaging, one or more semiconductor dice are affixed to each device area 105, where they are then subjected to wire bonding, encapsulation, and singulation processes, yielding individual IC packages.

In order to facilitate these processes, each device area 105 may include a number of leads 111, each supported at one end by the tie bars 107. In the illustrated embodiment, the leads 111 have contact posts 113 formed at the distal end of the lead. Each post extends to the bottom surface of the lead frame panel 101 to provide a conductive contact pad at the bottom surface of the lead frame. The leads 111 may be etched, half-etched, or otherwise thinned relative to the contact posts 113, so as to provide electrical connection to the contact posts 113 without leaving exposed conductive areas on the bottom surface of the lead frame panel 101. Although a specific microarray lead-frame panel 101 has been described and illustrated, the described invention may be applied to an extremely wide variety of other lead frame panels or strip configurations as well.

Generally, prior to encapsulation in a mold, the bottom surface of the lead frame panel 101, including the bottom surfaces of the contact posts 113, is secured to an adhesive tape. Dice are attached and electrically connected to the lead frame panel 101. By way of example, bonding wires are generally used to electrically connect the dice to the lead frame panel 101. It is important that the tape is sufficiently adhered to the bottom surface of the lead frame panel 101 such that during the encapsulation process, the molten encapsulant does not intrude in between the bottom surface of the lead frame panel 101 and the top surface of the tape, a phenomenon known as mold flash. Mold flashing is undesirable under contacts, such as contact posts 113, as the insulating encapsulant material may inhibit, or even prevent, electrical connection of the resulting package to other external devices.

As already stated, one relatively recently developed encapsulation process is known as film-assisted molding. In film-assisted molding, the bottom surface of the lead frame panel 101 is not pre-taped prior to encapsulation; rather, a populated lead frame panel (a lead frame having dice attached and electrically connected to it) is positioned on an adhesive film. A package specific lamination tool then presses on designated portions of the lead frame panel in order to increase the adherence between the adhesive film and the lead frame panel. This ensures that the portions of the lead frame panel that touch the adhesive film, and particularly the contacts, are firmly secured to the adhesive film. This reduces the likelihood of mold flashing on the bottom surface of these portions during encapsulation.

Generally, in film-assisted molding, the adhesive film is unwound from a reel. In various embodiments, an entire lead frame panel 101 may be positioned on the adhesive film prior to introduction into the mold. The mold is closed around the lead frame panel 101 and the adhesive film forming a seal. In one embodiment, an entire lead frame panel 101 may be positioned in the mold and encapsulated substantially simultaneously. It should be noted, that this is only an exemplary embodiment. Depending on the size and the arrangement of the device areas 105, it may be desirable or necessary to encapsulate a smaller array 103 of device areas 105 at one time. Subsequent to encapsulation and after the encapsulant material has cured, the encapsulated lead frame panel and film are removed from the mold and the film is separated from the lead frame panel.

In practice, the lamination tool must be designed to press on regions of the lead frame panel 101, such as the tie bars 107, without touching delicate portions of the dice or bonding wires in order to avoid damaging the bonding wires or other components. Hence, this approach requires a specific lamination tool for every different lead frame size and configuration of package that is to be encapsulated. This is undesirable, as these package specific lamination tools are expensive and soon rendered obsolete as new packaging configurations are developed, thereby significantly increasing the cost of packaging. Furthermore, the tool must be carefully aligned with the lead frame panel in order for the tool to avoid pressing on undesired regions of the lead frame panel. Additionally, these lamination tools must be properly inventoried and switched in and out of the encapsulating system for each different lot of lead frames. This naturally increases both the time in production as well as the risk of human error. An increase in the risk of human error may lead to an increased likelihood for package failures.

It is thus desirable to overcome these problems via the introduction of a universal lamination tool. In one embodiment, the lamination tool of the present invention uses compressed air to press the lead frame panel 101 against the adhesive film. In this manner, the lamination tool itself is not required to physically press on the lead frame panel. This may substantially reduce the likelihood of damage to the bonding wires or other delicate components during this stage of the encapsulation process. Moreover, such a lamination tool is not necessarily package specific making it applicable for a wide variety of package configurations and lead frame sizes.

Figure 2:
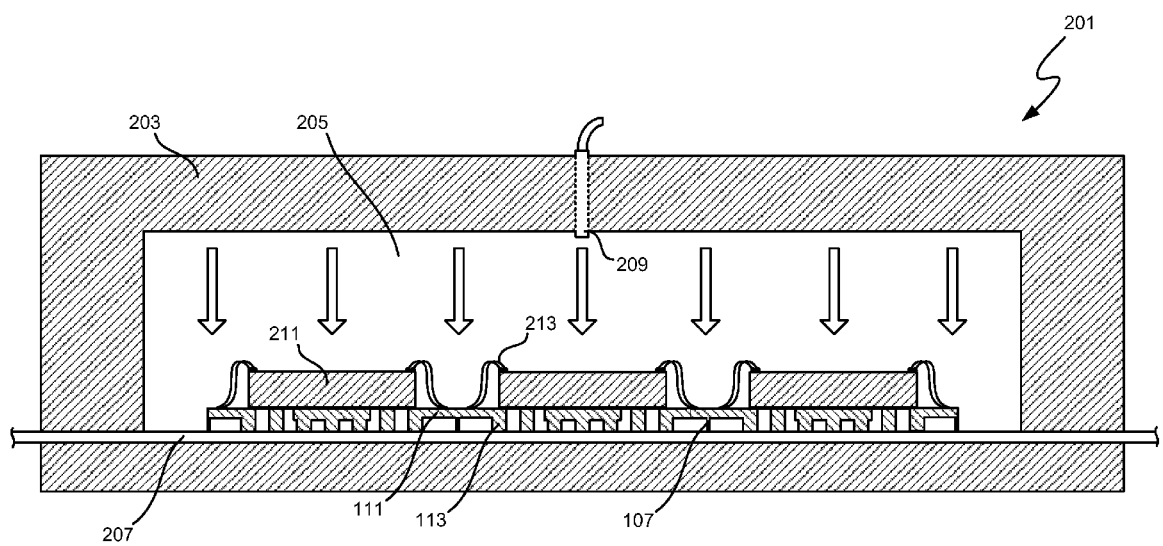
FIG. 2 illustrates a diagrammatic side view of a system suitable for use in packaging integrated circuits according to an embodiment of the present invention.

A universal lamination system 201 according to various embodiments of the present invention will now be described with respect to FIG. 2. In one embodiment of the present invention, the universal lamination system 201 may be coupled with a film-assisted molding system such that the universal lamination system 201 precedes the film-assisted molding system.

The lamination system 201 includes a housing 203 containing an inner chamber 205. In one embodiment, the chamber 205 may be configured to receive at least a portion of a populated lead frame panel such as lead frame panel 101. The populated lead frame panel 101 includes dice 211 that are electrically connected to the lead frame panel with bonding wires 213. In a preferred embodiment, the chamber 205 is configured to receive an entire populated lead frame panel 101. In an alternate embodiment, the chamber 205 is configured to receive a smaller array of device areas, such as two-dimensional array 103. The lead frame panel 101 is positioned on an adhesive film 207. The bottom surface of the adhesive film 207 lies adjacent to the bottom surface of the chamber 205. The chamber 205 may be arranged to enclose the lead frame panel 101 and the portion of the adhesive film 207 that the lead frame panel is positioned on. The housing 203 is preferably configured to seal the chamber 205 when it is closed around the lead frame panel 101 and adhesive film 201.

It should be noted that in some embodiments, vacuum lines may be arranged to extend to the bottom surface of the chamber 205. In this manner, when a vacuum is drawn, the adhesive film 207 on the bottom surface of the chamber 205 may be fixed relative to the bottom surface of the chamber. It should be noted that in these embodiments, the vacuum lines should only extend to portions of the bottom surface of the chamber 205 that are covered by the adhesive film 205. In this manner, the adhesive film 207, itself, allows the chamber 205 to be sealed despite the use of the vacuum lines.

The chamber 205 includes means to compress air within the chamber to an elevated pressure. It should be appreciated that a number of methods are suitable for compressing the air within the chamber 205. By way of example, in one embodiment, the chamber 205 includes an inlet 209 coupled with a compressor or compressed gas tank. The inlet 209 is configured to introduce the compressed air from the compressor or compressed gas tank into the chamber 205. It should be appreciated that in another embodiment, the chamber 205 may include a plurality of inlets 209. Having a plurality of inlets 209 may allow a more uniform introduction of air. In turn, this may allow a more uniform increase in pressure around the chamber 205. Additionally, it should be noted that it may be desirable to introduce a compressed gas, or gases, other than air within the chamber.

In an alternate embodiment, a portion of the housing 203 forming one wall of the chamber 205 may be arranged to translocate relative to the remainder of the housing. By way of example, the movable wall of the housing 203 may be the top portion (or roof) of the housing. It should be noted that the housing is preferably configured such that the chamber 205 remains sealed despite the chamber changing in volume. In this manner, the housing 203, itself, essentially forms a piston-like arrangement whereby the movable wall of the housing may be used to change the volume, and hence the pressure, inside of the sealed chamber 205. In embodiments employing this piston-like arrangement, no other compressor or compressed gas tank may be required.

If the pressure is introduced sufficiently gradually into the chamber 205, then the pressure of the gas may essentially act equally on all exposed surfaces of the populated lead frame panel 101. However, there is a greater exposed surface area on the top surface of the populated lead frame panel 101, including the dice, than there is on the bottom surface of the lead frame panel. The difference in surface area is approximately equal to the surface area of the portions of the lead frame panel 101 that contact the adhesive film 207. This difference in surface area results in a net force on the lead frame panel 101, represented by the arrows in FIG. 2, that presses the lead frame panel against the adhesive film 207. The gas is preferably compressed to an ample pressure such that the resultant net force on the lead frame panel 101 is sufficient to firmly secure the lead frame panel to the adhesive film 207. In general, the required pressure may depend on the size of the die, the size of each device area 105, the exposed surface area on the bottom surface of the lead frame panel, the thickness of the adhesive layer on the adhesive film 207 and the tackiness of the adhesive film, among other variables. The firmly secured adhesive film 207 prevents molding compound from covering the portions of the lead frame panel 101 that are in contact with the adhesive film during encapsulation.

It should be noted, that in various embodiments, the compressed gas is preferably introduced gradually. A gradual introduction of compressed gas may result in a more uniform and gradual increase in pressure within the chamber 205. A gradual increase in pressure reduces the likelihood that the delicate wire bonds are displaced or bent as a result of turbulence generated within the chamber 205. In some cases, turbulence may even be sufficient to displace the lead frame panel 101 itself. Displacement of the lead frame panel 101 may result in uneven adhesion between the lead frame panel and the adhesive film 207, which may in turn lead to an increased likelihood of mold flash during subsequent encapsulation.

The bottom portion of the housing 203 may also be configured as a heat platen. In this way, the housing 203 may heat the adhesive film 207 while it is in the chamber 205. Furthermore, the adhesive film 207 may be configured such that the adhesive film includes a heat-induced adhesive layer that responds to being heated with increased adhesiveness. In this way, even greater adhesion of the adhesive film 207 to the bottom surface of the lead frame panel 101 may be achieved.

Although described as an independent system, it should be noted that, in another embodiment, the universal lamination system 201 is incorporated within the film-assisted molding system. In such a system, the mold itself may be positioned within the chamber 205. Furthermore, the mold itself may serve as the housing 203 such that the mold cavity serves as the chamber 205. Additionally, it should be appreciated that although described in the context of a film-assisted molding system, the present invention may be employed in adhering adhesive films to lead frames or other substrates for conventional encapsulation systems as well as for other uses.

Figure 3:
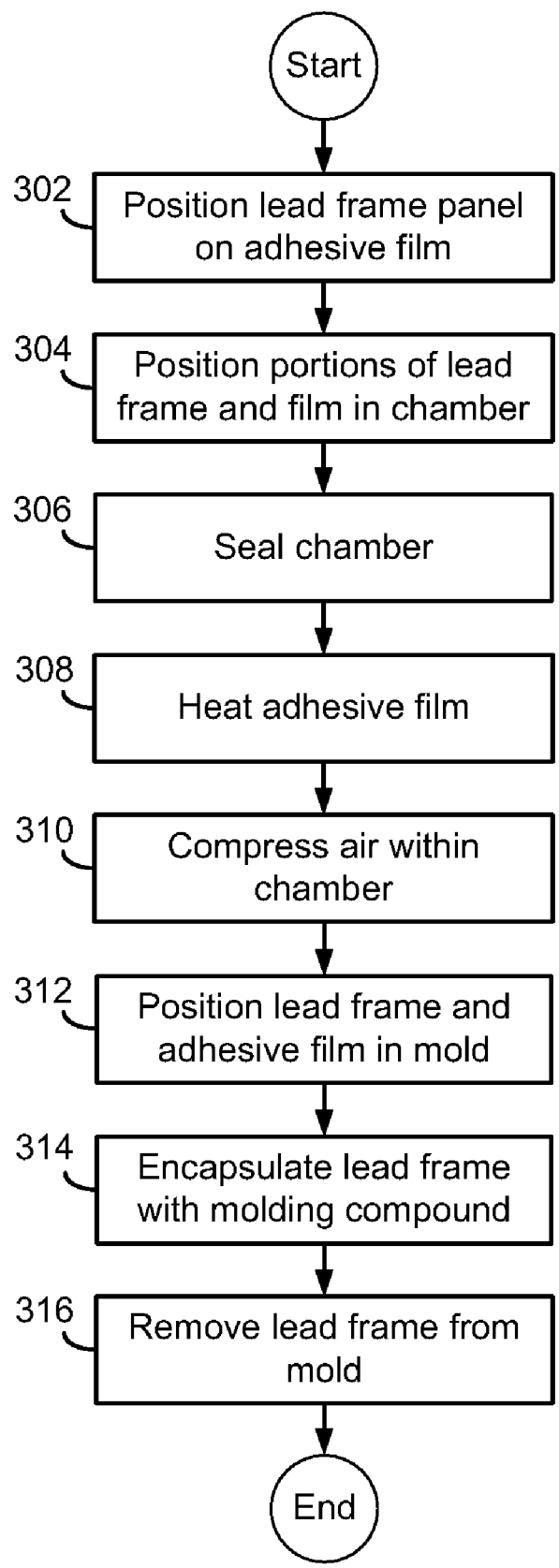
FIG. 3 is a flow chart illustrating a process for fabricating IC packages in accordance with an embodiment of the present invention.

In another aspect of the present invention, a method of adhering an adhesive film to the bottom surface of a lead frame panel will be described with reference to the flow chart illustrated in FIG. 3. At step 302, a lead frame panel is positioned on an adhesive film such that the bottom surface of the lead frame panel is in contact with the upper surface of the adhesive film. At 304, portions of the lead frame panel and adhesive film are positioned within a chamber. In a preferred embodiment, the entire lead frame panel is positioned within the chamber at once. In other embodiments, a smaller array of device areas may be positioned within the chamber. The chamber may then be sealed at 306. In one embodiment, the adhesive film may be heated via a heat platen coupled with the chamber at 308.

The air in the chamber may be pressurized at 310. In other embodiments, a compressed gas (or gases) may be used instead of air. The gas should be compressed to an ample pressure such that the resultant net force on the lead frame panel is sufficient to firmly secure the lead frame panel to the adhesive film without damaging the die, bonding wires, or other delicate electrical components. In general, the required pressure may depend on the size of the die, the size of each device area 105, the exposed surface area on the bottom surface of the lead frame panel, the thickness of the adhesive layer on the adhesive film 207 and the tackiness of the adhesive film, among other variables. Portions of the lead frame panel may then be positioned in a mold for encapsulation at 312. At 314, the lead frame panel may be encapsulated with a molding compound. The firmly secured adhesive film prevents the molding compound from covering the portions of the lead frame panel that are in contact with the adhesive film during encapsulation. Subsequent to encapsulation, and after the molding compound has cured, the lead frame panel and adhesive film may be removed from the mold at 316 whereupon the adhesive film may be removed from the lead frame panel. It should be noted that variations in the ordering of some of the aforementioned steps may be permitted.

The foregoing description, for purposes of explanation, used specific nomenclature to provide a thorough understanding of the invention. However, it will be apparent to one skilled in the art that the specific details are not required in order to practice the invention. Thus, the foregoing descriptions of specific embodiments of the present invention are presented for purposes of illustration and description. They are not intended to be exhaustive or to limit the invention to the precise forms disclosed. It will be apparent to one of ordinary skill in the art that many modifications and variations are possible in view of the above teachings.

The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. A method of adhering an adhesive film to a lead frame, comprising:

positioning at least portions of a lead frame within a chamber such that a bottom surface of the lead frame is in contact with an upper adhesive surface of an adhesive film and a bottom surface of the adhesive film is in contact with a bottom surface of the chamber;

sealing the chamber around the lead frame and the adhesive film; and after the sealing of the chamber, positively increasing pressure within the chamber, causing gas within the chamber to press harder against the lead frame such that the lead frame presses harder against the adhesive film, thereby increasing an adhesion of the adhesive film to the bottom surface of the lead frame.

2. A method as recited in claim 1, wherein the lead frame is a lead frame panel including a plurality of device areas, each device area having a die electrically connected to the device area.

3. A method as recited in claim 2, wherein the lead frame panel includes a matrix of tie bars that define at least one two-dimensional array of device areas.

4. A method as recited in claim 3, wherein the lead frame panel is in the form of a lead frame strip including a plurality of two-dimensional arrays of device areas.

5. A method as recited in claim 3, wherein an entire two-dimensional array of device areas is positioned within the chamber.

6. A method as recited in claim 2, further comprising positioning the lead frame panel having the adhesive film adhered to the bottom surface thereof in a mold and encapsulating the lead frame panel, dice and electrical connections with a molding material.

7. A method as recited in claim 6, further comprising peeling the adhesive film off of the encapsulated lead frame panel.

8. A method as recited in claim 1, further comprising heating the adhesive film in regions under the lead frame while the adhesive film is in the chamber thereby further increasing an adhesion of the adhesive film to the lead frame.

9. A method as recited in claim 1, wherein the gas is substantially comprised of air.

10. A method of adhering an adhesive film to a lead frame panel, comprising:

positioning at least portions of a lead frame panel within a chamber such that a bottom surface of the lead frame panel is in contact with an upper adhesive surface of an adhesive film and a bottom surface of the adhesive film is in contact with a bottom surface of the chamber, the lead frame panel including a matrix of tie bars that define a plurality of device areas on the lead frame panel, each device area connected with an integrated circuit die;

sealing the chamber around the lead frame panel and the adhesive film; and after the sealing of the chamber, positively increasing pressure within the chamber, causing gas within the chamber to press harder against the lead frame panel such that the lead frame panel presses harder against the adhesive film, thereby increasing an adhesion of the adhesive film to the bottom surface of the lead frame panel, wherein the harder pressing of the lead frame panel against the adhesive film is performed without any solid structure in the chamber directly pressing harder against any exposed portion of the lead frame panel within the chamber.

* * * * *